(12) United States Patent
Hofmann et al.

(10) Patent No.: US 10,129,997 B2
(45) Date of Patent: Nov. 13, 2018

(54) GUIDE ASSEMBLY FOR PROPER ELECTRICAL BLIND MATING OF A MODULE IN AN ENCLOSURE

(71) Applicant: Oracle International Corporation, Redwood City, CA (US)

(72) Inventors: Andres Gabriel Hofmann, Poway, CA (US); Rebecca Di Ricco Kurzava, San Diego, CA (US); Gabrielle Kariann Stetor, Sunnyvale, CA (US)

(73) Assignee: ORACLE INTERNATIONAL CORPORATION, Redwood City, CA (US)

( * ) Notice: Subject to any disclaimer, the term of this patent is extended or adjusted under 35 U.S.C. 154(b) by 70 days.

(21) Appl. No.: 15/399,517

(22) Filed: Jan. 5, 2017

(65) Prior Publication Data

US 2018/0192535 A1  Jul. 5, 2018

(51) Int. Cl.
*H05K 7/14* (2006.01)
*H01R 12/73* (2011.01)
*G06F 1/18* (2006.01)

(52) U.S. Cl.
CPC ......... *H05K 7/1454* (2013.01); *H01R 12/737* (2013.01); *H05K 7/1402* (2013.01); *H05K 7/1418* (2013.01); *G06F 1/181* (2013.01); *G06F 1/184* (2013.01); *G06F 1/185* (2013.01); *H05K 7/1401* (2013.01); *H05K 7/1404* (2013.01);
(Continued)

(58) Field of Classification Search
CPC .. H05K 7/1454; H05K 7/1413; H05K 7/1402; H05K 7/1418; H05K 7/1438; H05K 7/1455; H05K 7/1401; H05K 7/1404; H05K 7/1405; H05K 7/1408; H05K 7/1409; H05K 7/1417; G06F 1/181; G06F 1/184; G06F 1/185; H01R 12/737
See application file for complete search history.

(56) References Cited

U.S. PATENT DOCUMENTS 5,729,060 A * 3/1998 Shih ...................... G06F 1/184
307/112
5,793,614 A * 8/1998 Tollbom ............... H05K 7/1409
361/725

(Continued)

*Primary Examiner* — Steven T Sawyer
*Assistant Examiner* — Paresh Paghadal
(74) *Attorney, Agent, or Firm* — Marsh Fischmann & Breyfogle LLP; Kent A. Lembke

(57) ABSTRACT

A guide assembly an enclosure-based device such as a computer provided in a rack-mountable chassis. The guide assembly is configured to facilitate blind connector mating such as electrical interconnection between a receiving connector on a previously-mounted board and an edge connector on a circuit board supported in a housing of a module that is slid or inserted into the interior space of the enclosure or chassis. The guide assembly (and devices that include a guide assembly) address the two design challenges discussed above of increasing numbers of circuits in devices that need to be connected and of decreasing pitch between the connectors. The guide assembly is configured, with its mechanical features, to decouple the degrees of freedom (DOFs) between the module being inserted into the chassis and the receiving/mating connector on the previously-mounted board. The guide assembly constrains five out of the six DOFs, which effectively ensures proper connector mating.

16 Claims, 10 Drawing Sheets

(52) U.S. Cl.
CPC ......... *H05K 7/1405* (2013.01); *H05K 7/1408* (2013.01); *H05K 7/1409* (2013.01); *H05K 7/1455* (2013.01)

(56) References Cited

U.S. PATENT DOCUMENTS

| | | | | |
|---|---|---|---|---|
| 5,808,867 | A * | 9/1998 | Wang | G06F 1/18 361/679.49 |
| 6,288,902 | B1 * | 9/2001 | Kim | G11B 33/08 206/701 |
| 6,496,364 | B1 * | 12/2002 | Medin | H05K 7/1454 312/223.1 |
| 6,599,136 | B2 * | 7/2003 | Sheldon | H01R 12/727 439/92 |
| 6,746,282 | B2 * | 6/2004 | Meister | H01R 12/52 439/638 |
| 7,200,004 | B2 * | 4/2007 | Chen | G06F 1/188 361/679.39 |
| 7,345,869 | B2 * | 3/2008 | Hsiao | G06F 1/184 312/223.2 |
| 7,450,383 | B1 * | 11/2008 | Li | G06F 11/2015 361/695 |
| 8,758,040 | B2 * | 6/2014 | Wallace | H05K 7/1432 439/248 |
| 9,148,970 | B2 * | 9/2015 | Lu | H05K 7/02 |
| 9,451,721 | B1 * | 9/2016 | Shih | H05K 7/10 |

* cited by examiner

GUIDE ASSEMBLY FOR PROPER ELECTRICAL BLIND MATING OF A MODULE IN AN ENCLOSURE

BACKGROUND

1. Field of the Invention

The present invention generally relates to electrical interconnection during assembly of servers and other computer equipment, telecommunications equipment, and electronics in a standard enclosure or box (simply called "chassis" herein) that will then, often but not always, be mounted in a rack with other enclosures/boxes (i.e., each being a rack-mountable chassis), and, more particularly, to a guide assembly (or mechanical features providing guiding) for use to facilitate or ensure proper electrical blind mating of interconnects such as between connectors on two boards during assembly or reconfiguration of components (e.g., computer, telecommunications, electrical, and other components) within a chassis. For example, the guide assembly (e.g., set of mechanical features or components) may be well suited for providing compound motion alignment of blind mater electrical interconnects between two circuit boards such as a printed circuit board (PCB) or printed circuit assembly (PCA) (both simply called "boards" or circuit boards) provided in a module being hot swapped or inserted into the chassis and a PCB/PCA previously installed in the chassis (e.g., a board vertically mounted on a clamp within a chassis between two vertical chassis sidewalls that is or provides a midplane board (or midplane PCA)).

2. Relevant Background

There are numerous settings or environments where electronic equipment, computers and computer equipment (e.g., servers, routers, and so on), and telecommunications equipment are provided in a centralized location in standard or conventional racks. Often, this equipment is provided within a box or chassis that is then mounted within the rack. Such use of racks with configurable electronic or computer devices each in a chassis can be found in data centers, computer rooms, network rooms, control rooms, telecommunication centers, and so on.

Each chassis or enclosure may be assembled in a manner that requires blind mating between electrical connectors such as interconnects on two circuit boards. As a specific example, servers and other computing devices are often each provided in a chassis on a rack. During assembly or reconfiguration (or "hot swapping" to replace a component) of each of these devices, it is common for a PCB or PCA (or "board") to be mounted vertically in each with its ends extending between the vertical side walls of the chassis. Such a board is mounted between the rear and front ends of the chassis, and this PCA or simply "board" or "circuit board" may be a midplane board (or midplane PCA). A fan module (or other module) with a board (such as a fan module PCA or the like) is slid into the chassis by a technician, and, for proper operations of the fan module in the chassis, proper electrical blind mating of the interconnects between the fan module PCA (e.g., its edge connector) and the midplane board (e.g., one of its interconnects) is required. Achieving proper connection is difficult as it is problematic to handle the often relatively long module housing (e.g., 16 inches in length) and align a small connector on a board supported in the module housing with a receiving connector on a stationary board in the chassis' interior.

It is recognized throughout the computer and electronics industries that blind mate interconnections across circuit boards usually require very tight manufacturing and mechanical tolerances and/or expensive hardware. Further, as the microelectronics on the circuit boards get more and more complex the following critical design parameters or constraints are faced by chassis-based equipment designers: (1) the number of circuits that must be interconnected goes up in number and (2) the pitch (or spacing) between the connections goes down.

These two design constraints make it very difficult to achieve the goal of providing consistent and reliable connector mating between components inserted or later installed in a chassis and the components (e.g., a midplane or other board) already installed and supported within the enclosure. Currently, the need for blind mating of connectors is addressed, although not always successfully, by the combined use of very expensive connectors and/or specialized off-the-shelf mechanical hardware (e.g., guide pins, bushings, and the like). Hence, there remains a need for improved designs for ensuring proper blind mating of electrical interconnects during assembly of a product housed in a chassis (e.g., a server or the like).

SUMMARY

Briefly, a guide assembly is provided for an enclosure-based device such as a computer provided in a rack-mountable chassis and other devices that may have one or more PCBs/PCAs. The guide assembly is configured to facilitate blind connector mating such as electrical interconnection between a receiving connector on a previously-mounted board and an edge connector on a circuit board supported in a housing of a module that is slid or inserted into the interior space of the enclosure or chassis.

The guide assembly (and devices that include such a guide assembly) addresses the two design challenges discussed above of increasing numbers of circuits in devices that need to be connected and of decreasing pitch (or spacing) between the connectors. To this end, the guide assembly is configured (e.g., with its mechanical features or components) to decouple the degrees of freedom (DOFs) between the module (e.g., a fan module with a PCA in its housing) being inserted into the chassis and the receiving/mating connector on the previously-mounted board (e.g., an electrical interconnect on a midplane board (e.g., an IOEU midplane or the like)). In some embodiments, the guide assembly constrains five out of the six DOFs, which effectively ensures proper connector mating.

More particularly, an apparatus (e.g., an enclosure-based device such as a computer device, a telecommunications devices, and the like that may be rack-mountable) is provided that is adapted to facilitate insertion (e.g., hot-swapping) of modules to provide consistent blind mate interconnection. The apparatus includes a chassis including a first sidewall and a second sidewall opposite the first sidewall defining an interior space of the chassis for receiving one or more modules (such as fan modules, power modules, hard drive modules, and the like). The apparatus includes a clamp with a planar body extending within the interior space of the chassis between the first and second sidewalls of the chassis, and the apparatus also includes a first circuit board attached to the clamp, where the circuit board includes a connector extending away from the clamp into the interior space of the chassis. The apparatus also includes a module with a housing including a first sidewall and a second sidewall extending parallel to the first sidewall. A second circuit board is mounted between the first and second sidewalls of the module housing, and the second circuit board includes a connector extending outward from the housing proximate to lead-in ends of the first and second sidewalls. Further, the apparatus includes a guide assembly including a first set of guide members on the housing of the module and a second set of guide members extending from the body of the clamp. During use, abutting contact between the first set of guide members and the second set of guide members forces alignment between the connectors of the first and second circuit boards for blind mate interconnection as the module is inserted into the interior space of the chassis.

In some embodiments, the first set of guide members provide Y-axis alignment between the connectors of the first and second circuit boards, and the second set of guide members provide X-axis alignment between the connectors of the first and second circuit boards. In some particular embodiments, the X-axis and Y-axis alignments are provided at least partially concurrently by the guide assembly.

In the same or other embodiments, the first set of guide members includes a first pair of guide members extending from the lead-in end of the first sidewall that are spaced apart by a first alignment groove extending parallel to a longitudinal axis of the first sidewall. The second set of guide members may then include a second pair of guide members extending from the lead-in end of the second sidewall that are spaced apart by a second alignment groove extending parallel to a longitudinal axis of the second sidewall.

Then, to implement the apparatus, each of the first pair of guide members may include a planar body oriented at a bend angle away from a plane of the first sidewall toward a center axis of the module housing. Each of the second pair of guide members may include a planar body oriented at the bend angle away from a plane of the second sidewall toward a center axis of the module housing. Particularly, the bend angle may be greater than 15 degrees (such as 25 to 35 degrees or the like). In the same or other implementations, the first and second pairs of guide members each includes an upper guide member with a body having a lead-in side with a contact portion angled at an angle of at least 30 degrees (such as at about 45 degrees) from vertical toward the first and second alignment grooves, respectively. The first and second pairs of guide member each may include a lower guide members with a body having a lead-in side with a contact portion angled at an angle of at least 30 degrees from vertical toward the first and second alignment grooves, respectively.

In some cases, the second set of guide members includes a first clamp guide member and a second clamp guide member each with an outer side extending outward from the clamp body into the interior space and to a contact surface that includes a sloped portion angled at an angle of at least 30 degrees (e.g., 45 degrees or the like) away from the outer side. Each of the first and second clamp guide members may include a planar body orthogonal to the clamp body. The planar body of these clamp guide members can have a thickness less than a height of the first and second alignment grooves (such as to provide a tolerance or amount of wiggle in the vertical direction or in the Y-axis of 0.5 to 1 mm or the like), whereby the first and second clamp guide members are receivable in the first and second alignment grooves. The distance between the outer sides of the first and second clamp member guide members is in the range of 0.5 to 2 millimeters less than the distance between inner surfaces of the first and second sidewalls of the module housing in some useful embodiments. The outer sides of the first and second clamp members typically will have a length greater than a length of the first and second alignment grooves to provide continued alignment of the module after initial coarse alignment by engagement of the guide members of the guide assembly.

DETAILED DESCRIPTION

The present description is directed toward an assembly for guiding proper mating for blind mate interconnections between two circuit boards, one that has been previously mounted in a chassis or enclosure and one that is supported within a housing of a module being inserted or installed into the interior space of the chassis or enclosure. The device, such as a server in a rack-mountable chassis, a telecommunication device with interconnected circuit boards, and the like, that includes the guide assembly is also covered by the breadth of this description and the following claims.

As will be clear based on the following description, the guide assembly provides a significant improvement, relative to existing guide techniques, in the following two areas. First, the guide assembly can be implemented as a low cost solution, as it does not require specialized hardware (such as pressed-in pins, guides, and the like). Second, the guide assembly is typically directly manufactured onto or provided on the existing product part geometry (e.g., on a module's housing and its sidewalls and on a board clamp (or vertical support)), which reduces the number of parts and avoids the addition of unintended tolerances in the stack.

As a result of these improvements, the guide assembly will likely improve overall customer satisfaction (e.g., satisfaction of purchasers and users of enclosure-based devices including the guide assembly) by increasing the success rate when inserting/replacing modules onto a system. The "modules" including features of the guide assembly may vary but include fan modules, hard disk drives (HDDs), expansion boards, service processor modules, power supplies, and the like. The guide assembly also likely will reduce the number of service calls that previously were received due to improper mating. For example, a customer may replace a fan module that has failed with a new module, but, due to improper mating of blind mate interconnections, the customer is forced to request additional on-site technical support.

Figure 1:
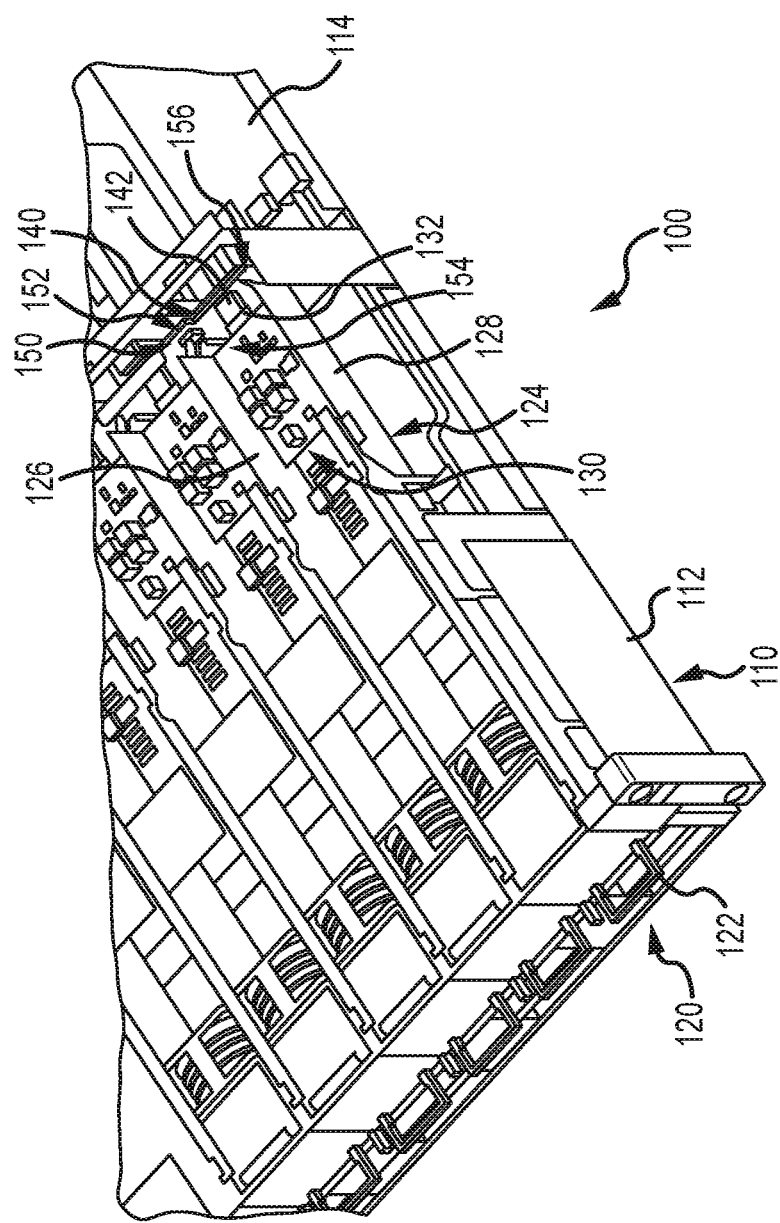
FIG. 1 illustrates a top partial perspective view of an enclosure-based device (e.g., a server or other computing device in a chassis for rack mounting) with a top cover and sidewall portions removed from the enclosure showing an inserted module (e.g., a fan module) with full mating, which is supported by a guide assembly of the present description, between a board on the module and a board mounted in the interior space of the enclosure (e.g., a midplane board)

FIG. 1 illustrates a top partial perspective view of an enclosure-based device (e.g., a server or other computing device in a chassis for rack mounting) 100. In FIG. 1, a top cover and sidewall portions are removed (not shown) from an enclosure or chassis 110 with a sidewall 112 and a base 114 shown to illustrate that the enclosure 110 defines or includes an interior space for receiving a plurality of components to assemble or fabricate a computer, a telecommunications, or other device 100, and these components placed in this interior space often will include circuits on boards that have to be interconnected with blind mating.

In this exemplary device 100, for example, a number of fan modules including module 120 with its handle 122 (e.g., for handling during insertion and removal) and its housing 124 including left and right sidewalls 126 and 128 have been inserted into the interior space of the enclosure 110. In the figure, a cover and portions of the sidewalls of the enclosure are not shown/are removed to show the inserted module 120 (e.g., a fan module) with full electrical connection or mating with a previously mounted board 140 (e.g., a midplane board or the like). The board 140 is shown to be orthogonal to the enclosure base (e.g., to extend vertically between the two sidewalls 112 of the enclosure 110).

The module 120 includes a circuit board 130 (e.g., a fan PCB/A) with an edge connector (or electrical interconnect or connector) 132 with an exposed edge or end, and the connector 132 is shown to be fully mated (proper blind mating) with a receiving/mating connector 142 on the board 140. The device 100 further includes a clamp (or board support) that is not shown (or is removed) in FIG. 1 to facilitate viewing or showing the mating achieved between the boards 130, 140 via their interconnects 132, 142, and the clamp is used to mount the board (or midplane board) 140 and would be positioned between the board 140 and the module 120.

The full mating of connectors 132, 142 is achieved through inclusion of a guide assembly 150 of the present description, and, as explained below, a portion of this guide assembly 150 (e.g., the portion used to provide coarse side-to-side alignment or X-axis alignment) is provided on the board clamp not shown in FIG. 1. A second portion of the guide assembly 150, which provides coarse up-and-down alignment or Y-axis alignment, is provided at the end of the module housing 124 that is inserted first into the interior space of the enclosure 110 (e.g., upon the lead-in end of the module 120).

The guide assembly 150 is explained in detail below, but, in brief, the up-and-down (or Y-axis) alignment is provided by two pairs of spaced apart guide members with each pair provided on the leading edge or interior end of the left and right sidewalls 126 and 128. The spacing between these pairs of guide members is used for receiving the board 130 (e.g., the connectors 132, 142 can be seen to be mated in this space between the guide members in FIG. 1), and, between each pair of guide members is an alignment groove for receiving a guide member extending outward from the board clamp (not shown in FIG. 1) to provide Y-axis alignment of the module 120 in the interior space of the enclosure. In FIG. 1, the guide assembly 150 is shown to include guide members 152, 154 (or an upper left guide member 152 and a lower left guide member 154) and guide member 156 (or an upper right guide member 156 with the lower right guide member not being visible in the view of the device 100 of FIG. 1).

Figure 2:
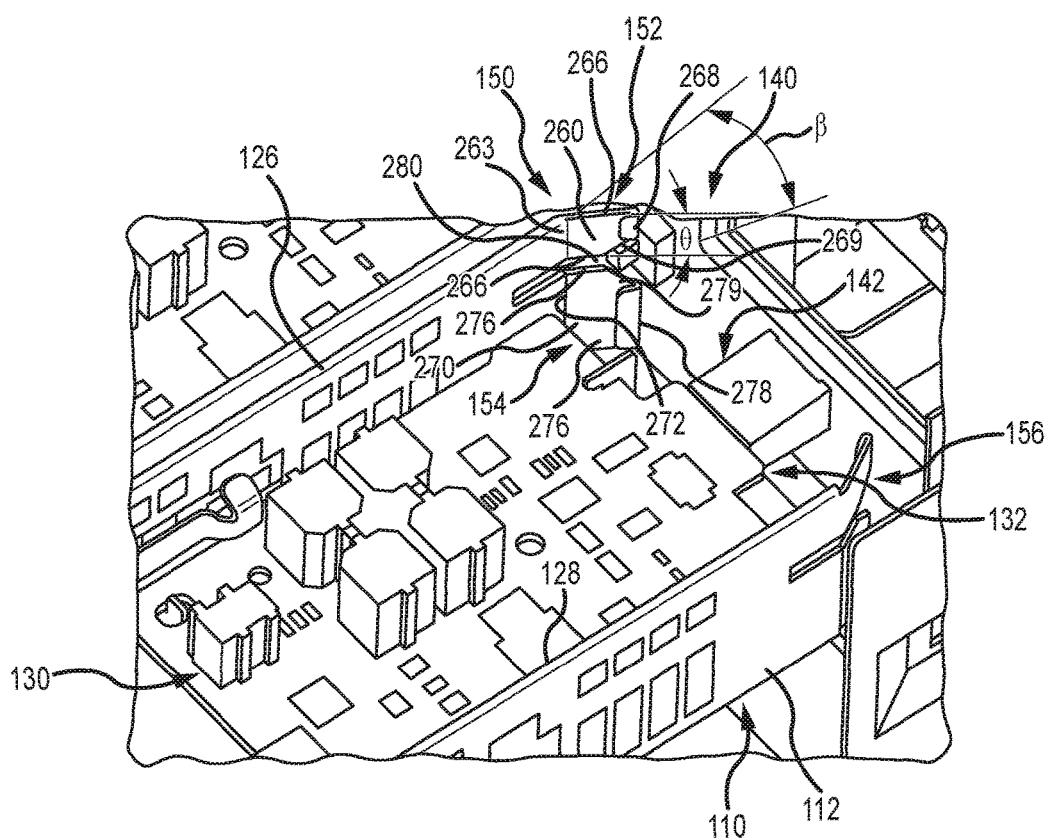
FIG. 2 illustrates a detailed or enlarged view of the device of FIG. 1 showing the guide assembly features in more detail including the set of guide members on the lead-in end of the module housing.

FIG. 2 illustrates a detailed or enlarged view of the device 100 of FIG. 1 showing the guide assembly 150 and its features in more detail, including the set of guide members 152, 154, and 156 on the lead-in end of the module housing 120. Again, it should be understood that a clamp or board support is not shown to more clearly illustrate features of the guide assembly 150 provided on the module 120. As shown, the module 120 has been fully inserted into the interior space of the chassis/enclosure 110 with a board 130 supported in the housing 120 between opposite sidewalls 126, 128 and with sidewall 128 proximate (in this example) to the sidewall 112 of the enclosure 110. The midplane board 140 is vertically mounted within the interior space of the housing 110, and, with the module 120 fully inserted, the receiving connector 142 of the midplane board 140 and the edge connector 132 (mostly hidden because it is received in the connector 142) of the module board 130 are properly interconnected.

To achieve this blind mate interconnection between the boards 130, 140, the guide assembly 150 is provided in part with four guide members (or two spaced-apart pairs of guide members) on the module housing 124. Particularly, a first pair of guide members 152, 154 is provided on the inner or lead-in end of the left sidewall 126, and a second pair of guide members 156 (with a lower right guide member not shown as it is hidden from view in FIG. 2) is provided on the inner or lead-in end of the right sidewall 128. The guide members in each pair take similar form, shape, and size, and, hence, the present discussion will be limited to left upper and lower guide members 152, 154 on the left housing sidewall 126 with the understanding that these descriptions apply to the opposite pair of guide members (of course, with the bend angle being in the opposite direction such that each guide member bends "inward" or toward the center line or longitudinal axis of the module 120).

Beginning with the upper left guide member 152, the member 152 includes a body 260 that may be planar and formed of sheet metal, plastic, or the like (such as from the same material as sidewall 126). The body 260 includes a first side (or edge) 262 that is joined or rigidly coupled to the lead-in edge/side of the sidewall 126, and the body 260 also includes second and third sides/edges 264, 266 extending (in a parallel manner, in this example) from the first or inner side 262. The body 260 further includes a fourth or leading side 268, which provides or defines the contact surface used to contact and guide other features (additional guide members or arms) of the guide assembly 150 provided on the clamp/board support, which are discussed in more detail below.

A number of configurations may be used for the upper guide member 152. In the example shown, the body 260 is bent inward at a bend angle, β, as measured from the plane containing the sidewall 126 to the plane of the body 260, in the range of 30 to 60 degrees (e.g., about 45 degrees in some cases). The bend of the body 260 acts to: (1) guide the module 120 into the initial opening or receiving space in the enclosure/chassis 110; (2) the bent inward guide members 152, 154, 156 at least partially enclose and protect the board connector 132 to limit risk of damage during insertion; and (3) by bending the body 260 inward, the body 260 engages the guide members of the clamp/board support in the Y-axis (up and down or vertically) sooner than in the X-axis (side-to-side).

The leading or fourth side 268 includes an angled or sloped lower portion 269, at an angle, θ, of 15 to 60 degrees such as 30 degrees as measured from the third edge/side 266. This angled/sloped lower portion 269 acts to contact and guide a contacting object (e.g., an edge of a guide member on the clamp/board support) into an alignment slot/groove 280, which is provided between the upper and lower guide members 152, 154. The alignment slot/groove 280 typically will have a height that is some amount greater than a thickness of clamp guide member to be received in the slot/groove 280 to provide a desired amount of "wiggle" (e.g., 0.5 to 1 millimeter of movement may be allowed in some cases along the Y-axis) in the vertical direction or Y-axis during alignment of the module 120 within the enclosure/chassis 110. The depth of the alignment/slot 280 may also be varied to practice the guide assembly 150, with some embodiments using a depth of 2 to 15 millimeters or more.

The lower left guide member 154 also includes a body 270 with a first side 272 coupled/joined to the lead-in edge/side of the left sidewall 126 of the housing 124 of the module 120. The body 270 further includes second and third side 274, 276 extending (in a parallel manner in the embodiment of FIG. 2) from the first side 272 to a leading or fourth side 278. As with the upper left guide member 152, the body 270 is provided bent inwards at the bend angle, β, for similar reasons as for the body 260. In the illustrated embodiment, the fourth side 278 includes an angled or sloped upper portion 279 (e.g., at an angle, θ, as measured from the second side/edge 274) proximate to but spaced apart from the sloped lower portion 269 of the upper left guide member 152 (e.g., these two sloped portions/surfaces 269, 279 face each other across the alignment slot/groove 280). In this manner, a guide member on the clamp that contacts the leading side 278 is guided by the sloped/angled portion 279 into the alignment groove/slot 280 to provide alignment relative to the Y-axis.

Figure 3:
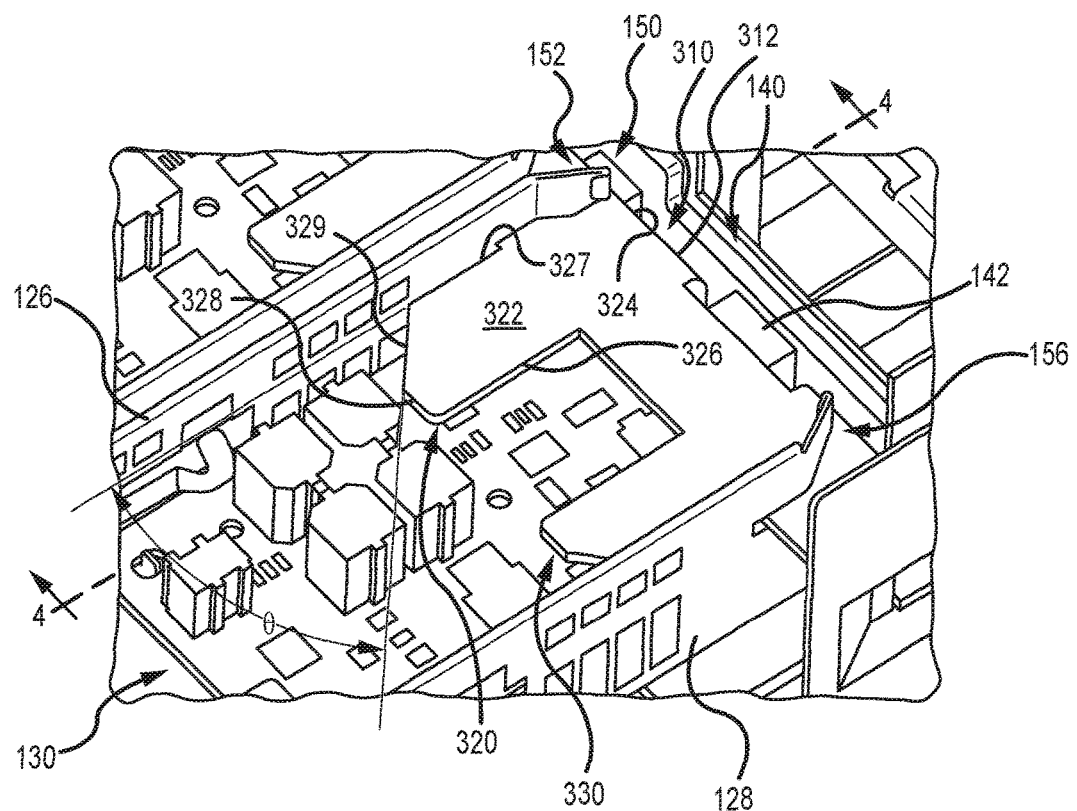
FIG. 3 illustrates a detailed or enlarged view of the device of FIG. 1 as modified to include a clamp or board support (e.g., a midplane mounting clamp or the like) showing additional features of the guide assembly of the present description.

FIG. 3 illustrates a detailed or enlarged view of the device 100 of FIG. 1 similar to that shown in FIG. 2 but modified to include a clamp or board support (e.g., a midplane mounting clamp or the like) 310. The clamp 310 includes a planar body 312 that is mounted to the enclosure housing 110 such as to base 114 to extend between sidewalls 112 of housing 110 shown in FIG. 1. The clamp 310 is used to support and mount the board 140 within the interior space of the chassis/enclosure 110, and the body 312 of the clamp 310 is disposed between the board 140 and module 120, with openings/holes through which board connectors such as connector 142 may pass for connection to modules such as to the connector 132 of board 130 in module 120.

The clamp 310 also includes features of the guide assembly 150 that are configured for providing alignment of the module 120 in the X-axis or side-to-side upon its insertion to ensure blind mate interconnection between the board connectors 132, 142. Further, the features of the guide assembly 150 on the housing 124 and on the clamp 310 act in combination to provide X and Y-axis alignment in a concurrent manner. Particularly, the guide assembly 150 includes, on clamp 310, a left guide member (or arm) 320 and a right guide member (or arm) 330 for each module to be installed into the interior space of the enclosure 110 including the module 120. The two guide members/arms 320, 330 have similar configurations such that description is only provided for guide member/arm 320 but is applicable to member 330 (but with the sloped surface/side angled in the opposite direction as shown in FIG. 3).

The guide member/arm 320 has a body 322, which may be planar and formed of the same material (e.g., steel, plastic, or the like) as the clamp body 312 and which may have a thickness similar or matching that of the clamp body 312 and a width that may vary to practice the assembly 150 but may be in the range of 2 to 20 millimeters or the like. The body 322 has a first side 324 coupled or joined to the upper edge/side of the clamp body 312, and the body 322 may extend outward from the clamp body 312 at 90 degrees in some cases (e.g., to have the body 322 be substantially parallel to the base 114 of the enclosure/chassis 110). The body 322 also has second and third (or inner and outer) sides 326, 327, with the third or outer side 327 providing a contact surface for mating with or being proximate to the inner surface or side of the sidewall 126 when the module 120 is inserted to a depth beyond the guide members 152, 154, 156.

In this regard, the body 322 has a length that exceeds (such as by 5 or more millimeters) a length of the bodies 260, 270 of the guide members 152, 154. In this way, the outer side 327 (along with the outer side of guide member 330) acts to provide final or continuing alignment of the module 120 during its insertion through contact with inner surfaces of the sidewall 126 (and sidewall 128) of the module housing 124. The distance between the two outer sidewalls of the guide members 320, 330 is, therefore, chosen to be a small amount less than the distance between inner surfaces/sides of the module's sidewalls 126, 128 (such as 0.5 to 1 mm less to provide some tolerance or wiggle in the X-axis or in the side-to-side direction).

Further, for initial coarse alignment in the X-axis, the body 322 includes a leading or fourth side 328 with an angled or sloped outer portion 329. This outer portion or surface 329 typically will provide initial contact with the guide members 152, 154 (e.g., with their angled lower and upper portions 269, 279) on the module housing sidewall 126, and the outer portion or surface 329 is angled inward (as measured from the plane of side 327) as shown with angle, φ, that may be in the range of 30 to 60 degrees (such as about 45 degrees in some cases). This slope or angle of surface 329 is provided to guide or urge the module 120 into proper X-axis alignment (between two board connectors) by causing right or left movement that places both of the members/arms 320, 330 between the sidewalls 126, 128 of the module housing 124 as is shown in FIG. 3 (and as is explained in more detail below). In FIG. 3, the two board connectors 132, 142 are fully and properly mated, and, in this position of the module 120 relative to the enclosure 110, the body 322 of the arm/guide member 320 is wholly received in the alignment groove/slot 280 between the guide members 152, 156 (which acted to provide Y-axis alignment by limiting vertical or up-and-down movement during insertion of the module 120 into the chassis 110).

Figure 4:
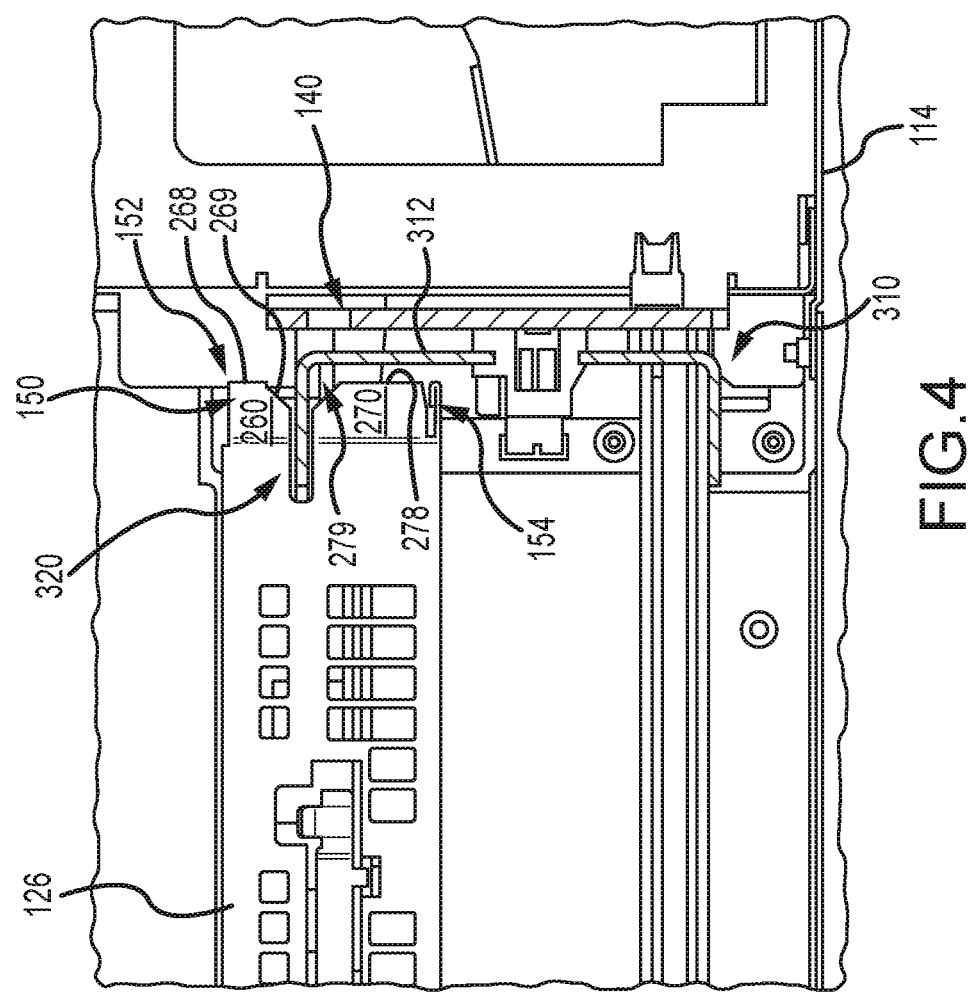
FIG. 4 is a sectional view of the device of FIG. 3 taken along line 4-4.

FIG. 4 is a sectional view of the device 100 of FIG. 3 taken at line 4-4. FIG. 4 is useful for showing that the guide members 152, 154 on the module housing 124 combined with the guide member 320 on the clamp 310 function as a composite alignment feature in that together they provide X-axis and Y-axis alignment of the module (e.g., fan module) 120 relative to the board 140 mounted in the enclosure 110 with the clamp 310. FIG. 4 clarifies that the angled/sloped surfaces 269, 279 on the upper and lower left guide members 152, 154 vertically guide the housing 124 into alignment with the clamp 310 as contact with the clamp's left guiding member 320 causes upward or downward movement toward the alignment groove/slot 280 between the guide members 152, 154. FIG. 4 also shows that the body 322 of the left clamp guide member 320 is oriented horizontally (or substantially so) as it extends outward from the body 312 of the clamp 310 orthogonally and away from the board 140 (toward the space where a new module 120 is inserted into the enclosure 110).

Figure 5:
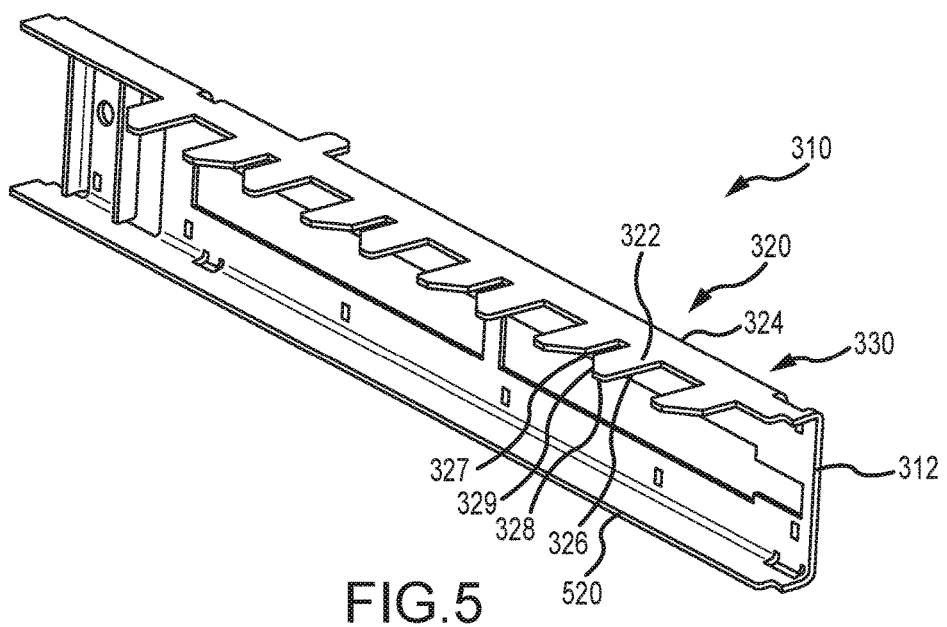
FIG. 5 is a top perspective view of the clamp or midplane board support included in the device of FIGS. 3 and 4.
Figure 6:
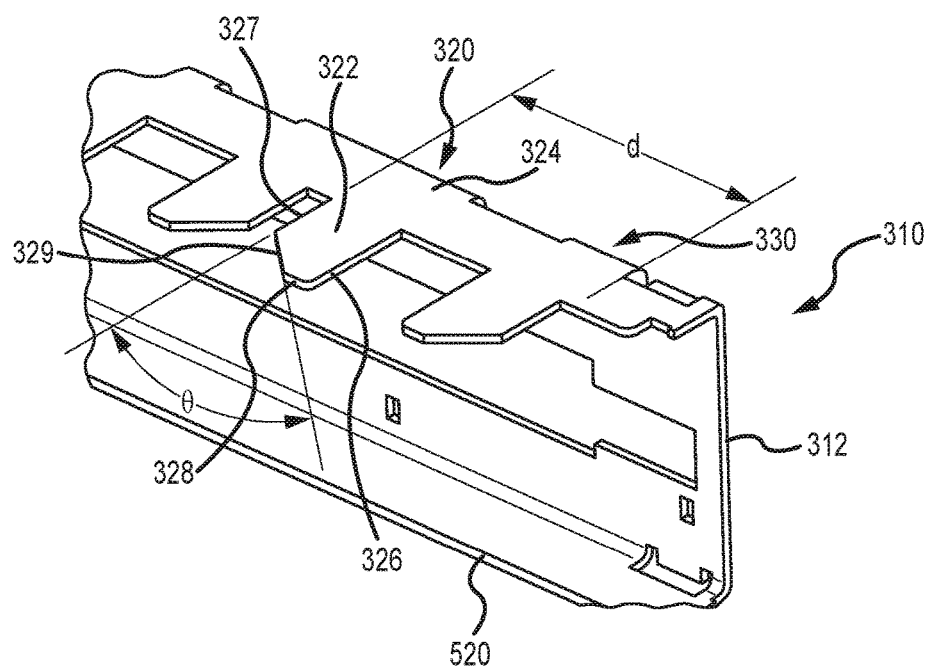
FIG. 6 is an enlarged view of an end of the clamp or board support shown in FIG. 5.

FIG. 5 is a top perspective view of the clamp or midplane board support 310 included in the device of FIGS. 3 and 4, and FIG. 6 is an enlarged view of an end of the clamp or board support 310 of FIG. 5. As shown, the clamp 310 includes a planar body 312 with spaces/gaps to allow electrical interconnectors such as the connectors of a board attached to the clamp body 312 to pass and/or be accessed through the clamp 310. The mounting of a board (such as circuit board 140 shown in FIG. 1-4) to the clamp 310 sets or defines the position of the board's connectors with regard to the clamp 310 such that X and Y-axis alignment of a module with the clamp 310 will also provide X and Y-axis alignment of a board mounted on the module and its connectors with the connectors on the board attached to the clamp (e.g., the previously mounted and/or receiving board).

The configuration of the clamp body 312 may vary with the gaps/spaces chosen to suit the board mounted on the clamp 310 and its connector number and locations. Also, while not required, a stiffening element 520 may be provided along a bottom edge/side of the clamp body 312, and the body 312 may have a length that suits the width of the interior space of the enclosure in which it is used such as to extend entirely across the interior space between enclosure sidewalls.

As discussed with reference to FIG. 3, the clamp 310 includes a pair of spaced apart guide members 320 and 330 for each module to be inserted into an enclosure. Clamp 310 is shown to include five pairs of such guide members for guiding five enclosures to proper alignment between two or more boards, and the spacing between pairs is chosen to allow a module housing sidewall to pass between the pairs of guide members. The leading or fourth side 328 of the guide member 320 includes a sloped or angled outward-facing portion 329, which is angled or sloped at the angle, ϕ, which may be in the range of 30 to 60 degrees (with 45 degrees being used in one embodiment). This leading side 328 is the first surface of the body 322 to contact guide members of a module being inserted into an enclosure in which the clamp 310 is installed, and the sloped surface/portion 329 urges or guides the module to the left or right or to an aligned position in the X-axis.

When aligned, the outer side 327 is facing and, in some cases contacting, an inner surface/side of a module sidewall (e.g., the left guide member 320 would be proximate to and/or in contact with the left sidewall of the module to ensure alignment in the X-axis). The distance, d, between the two outer surfaces/sides of the left and right guide members 320, 330 defines the amount of or limits the X-axis travel of the module within the interior space of the enclosure, and this distance, d, is often chosen to provide some "wiggle" during insertion (coarse alignment) such as with 0.5 to 1 mm or more different between the distance, d, and the distance between inner sides/surfaces of left and right sidewalls of a module. "Wiggle" or movement in the Y-axis is controlled or limited by defining the alignment groove/slot between upper and lower guide members on the housing to be some predefined amount larger than the thickness of the body 322 of the clamp guide member 320 so that up-and-down movement is limited when the clamp guide member 320 is in the groove/slot (e.g., slot 280 discussed above).

Figure 7:
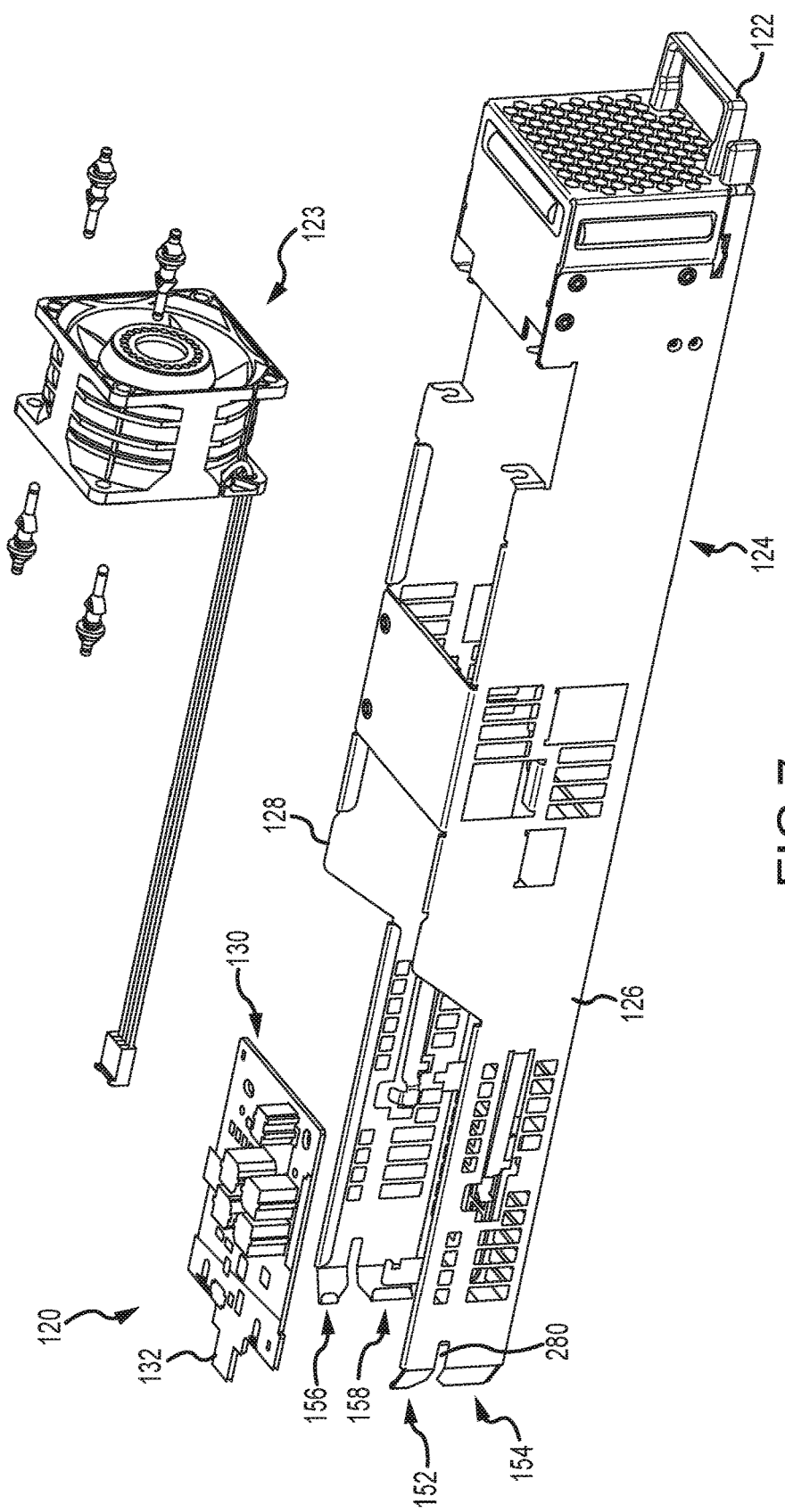
FIG. 7 is an exploded perspective view of the module used in the enclosure-based device of FIG. 1 showing the edge connector on the board mounted in the module housing and also showing all four guide members of the guide assembly provided on the module housing.

FIG. 7 is an exploded perspective view of the module 120 used in the enclosure-based device 100 of FIG. 1. With the module disassembled, it can be more easily seen that the exemplary (but not limiting) module 120 is a fan module, and the module 120 includes a fan PCA 130 with an edge connector 132 and a fan 123 that would be connected and controlled by the fan PCA 130. In addition to showing the edge connector 132 on the board 130 that will be mounted in the module housing, FIG. 7 also shows all four guide members 152, 154 (upper left guide member and lower left guide member) and 156, 158 (upper right guide member and lower right guide member) of the guide assembly (assembly 150 in FIG. 1) provided on the module housing 124. Particularly, the first pair of guide members 152, 154 (which guide the corresponding guide members or arms of a clamp into the alignment slot/groove 280) extend outward at an inward bend angle from the leading edge or side of the left sidewall 126 while the second pair of guide members 156, 158 extend outward at an inward bend angle from the leading edge or side of the right sidewall 128 of the module housing 124.

Figure 8:
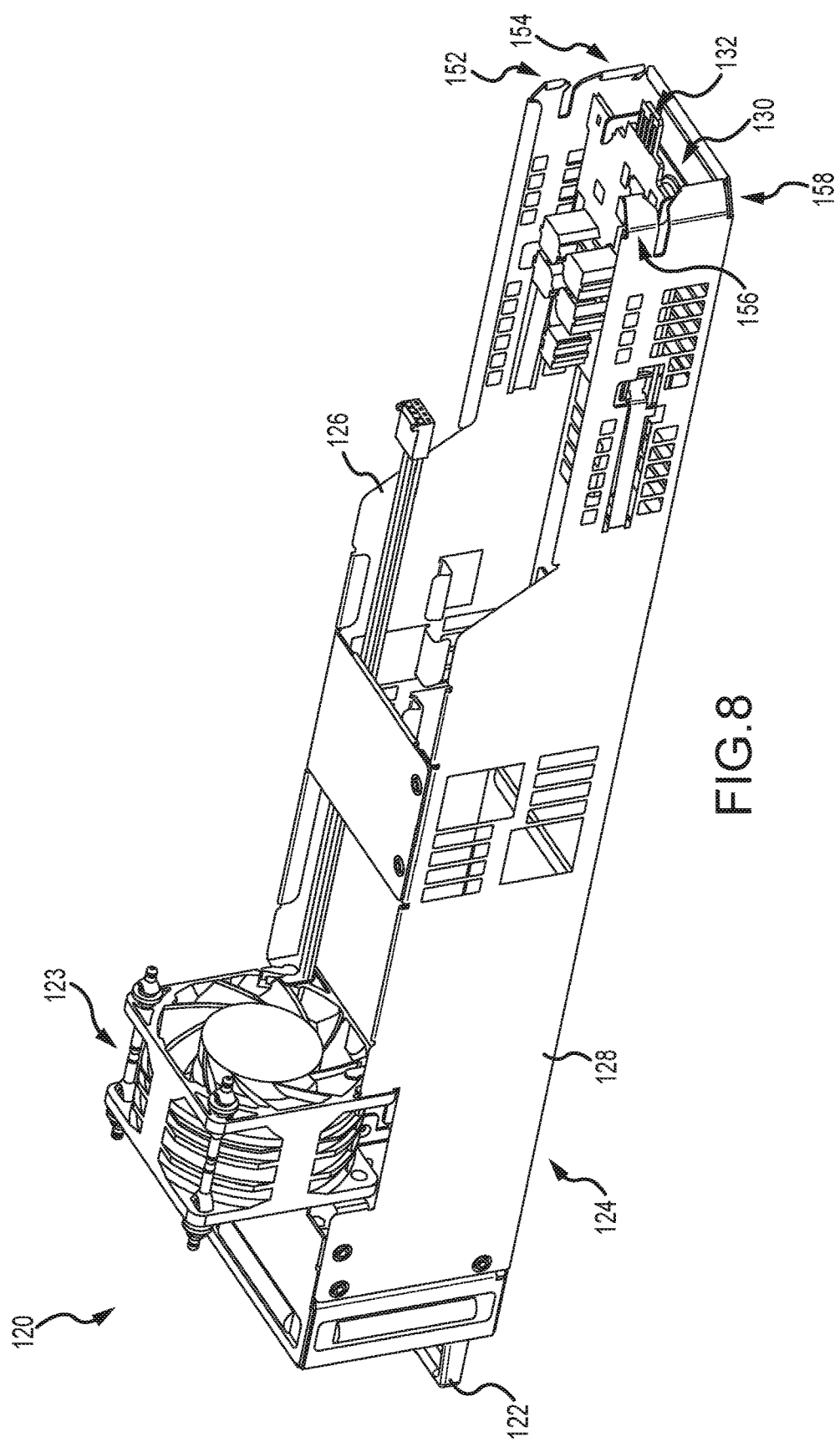
FIG. 8 is a partial exploded perspective view similar to FIG. 7, but from the opposite side, after installation of the board and partial installation of the fan.

FIG. 8 is a partial exploded perspective view similar to FIG. 7, but from the opposite side and after installation of the board 130 into the housing 124 and after partial installation of the fan 123. FIGS. 7 and 8 are useful for showing that the guide members in each pair are similarly configured and oriented with member 152 matching member 156 (but with both being bent inward) and with member 154 matching member 158 (but, again, with both being bent inward). FIG. 8 also shows that the bending of the guide members 152, 154, 156, 158 acts to at least partially enclose and protect the edge connector 132 on the board 130 while it is being inserted e.g., more likely that objects including the guide members on the clamp in the housing will contact the guide members before striking the edge connector 132. FIGS. 7 and 8 also show how coarse Y-axis alignment is initiated first (or before X-axis alignment) as the angled portions of the four guide members 152, 154, 156, 158 function to guide the module housing 124 into vertical alignment with the stationary and previously mounted clamp and its guide member or arms and into the alignment groove 280 (and a similar groove is provided between guide members 156, 158).

Figure 9:
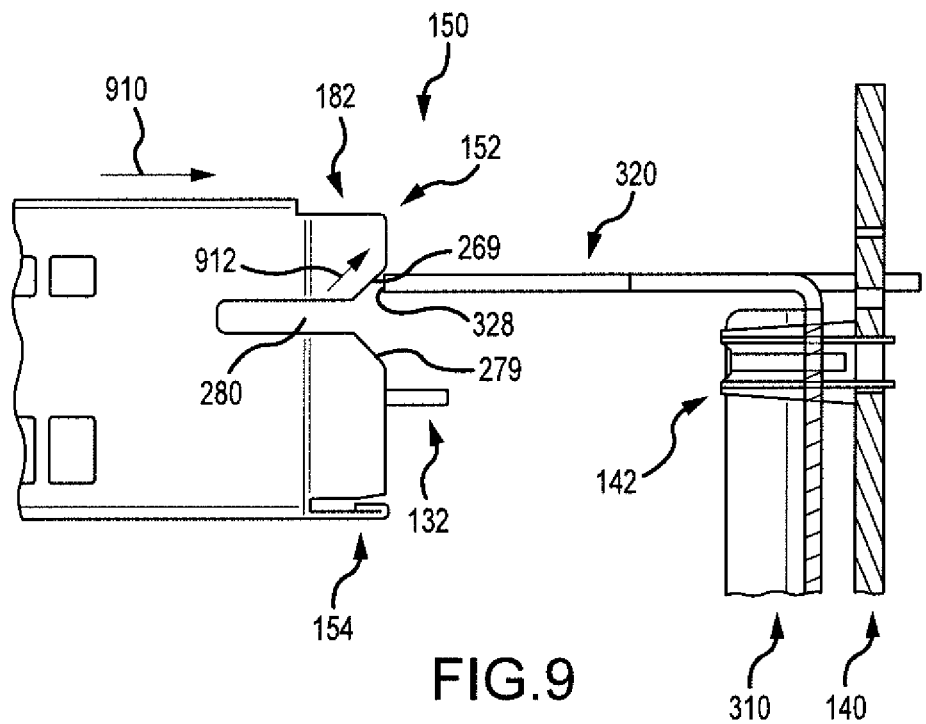
FIGS. 9 and 10 are partial side sectional views of the device of FIG. 3 illustrating Y-axis alignment provided by the guide assembly with FIG. 9 showing a module being inserted immediately prior to exemplary unaligned contact between the module and guide members of the clamp and after coarse Y-axis alignment and continued insertion of the module (but prior to blind mate connection is completed between board connectors)
Figure 10:
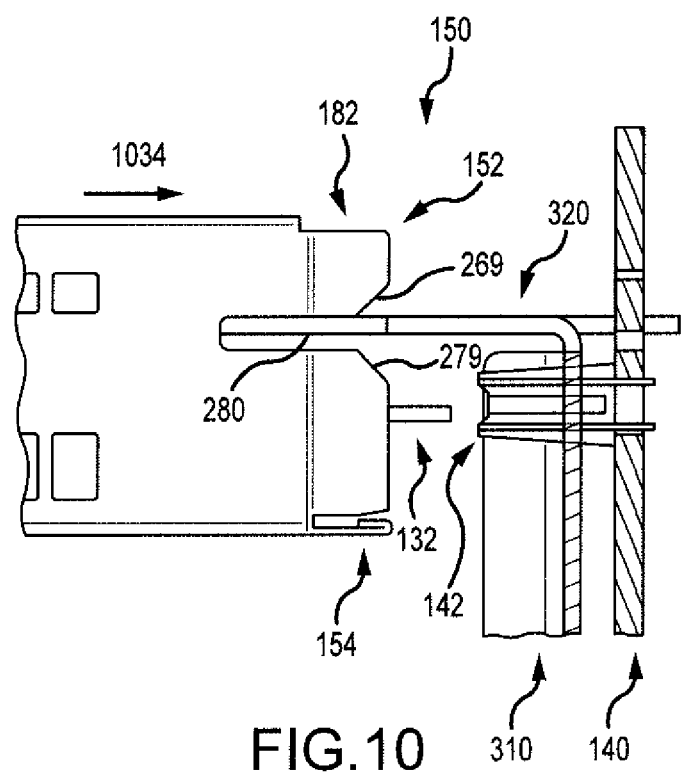

FIGS. 9 and 10 are partial side sectional views of the device 100 of FIG. 3 illustrating Y-axis alignment provided by the guide assembly 150. In FIG. 9, the module 120 is being inserted and the leading end of the module housing 124 is at a point in the insertion that is immediately prior to contact. Specifically, the module housing 124 is not properly aligned in the insertion process of FIG. 9. Particularly, it can be seen that the guide member 320 on the clamp 310 is not properly vertically (or in the Y-axis) aligned with the alignment groove or slot 280, which shows improper alignment between the module 120 and the clamp 130 (and the board 140 so not proper Y-axis/vertical alignment between connectors 132, 142 of the module board 130 and the receiving/previously mounted board 130). FIG. 10 illustrates the device 100 after coarse Y-axis alignment is provided by the components/features of the guide assembly 150 and with continued insertion 1034 of the module 120 (but prior to blind mate connection is completed between board connectors 132, 142).

As seen in FIG. 9, as the module 120 is slid inward, as shown with arrow 910, into the interior space of the enclosure/chassis 110, the angled/sloped portion 269 contacts the outer or fourth side 328 of the guiding member 320 on the clamp 320. As shown with arrow 912, the clamp 320 with its guiding member 320 forces the module up (in this example, but in other cases it may force the module downward) such that clamp guiding member 320 is aligned vertically with the groove/slot 280 with the movements 910 and 912. With this coarse vertical or Y-axis alignment as shown in FIG. 10, the board 130 in the module 120 (and its edge connector 132) will align with the board 140 mounted by the clamp 310 in the interior space of the enclosure 110 (and its electrical interconnect 142). Hence, with Y-axis alignment provided with the guide member 320 received within the slot/groove 280, the further insertion 1034 will force a consistent, proper mate between the two board connectors 132, 142 under all conditions.

Figure 11:
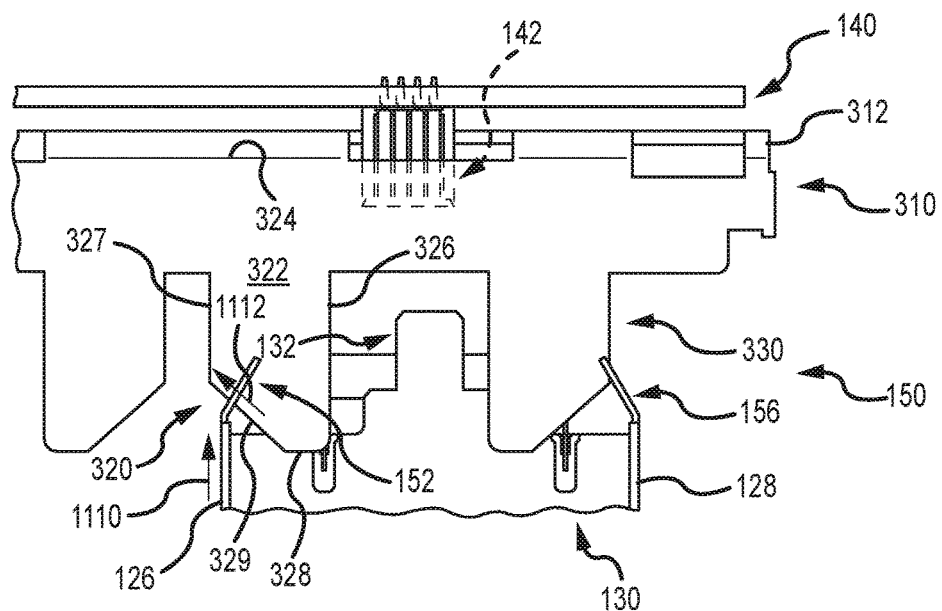
FIGS. 11 and 12 are partial top views of the device of FIGS. 3, 9, and 10 illustrating X-axis alignment provided by the guide assembly with FIG. 11 showing a module after initial engagement between the guide members on the module housing and on the clamp adjust the X-axis (or side-to-side) position of the module housing relative to the clamp and with FIG. 12 showing the module after coarse X-axis alignment has been achieved by the guide assembly but prior to final blind mate connection is completed between the board connectors (i.e., before fine alignment is provided at/by the connectors themselves).
Figure 12:
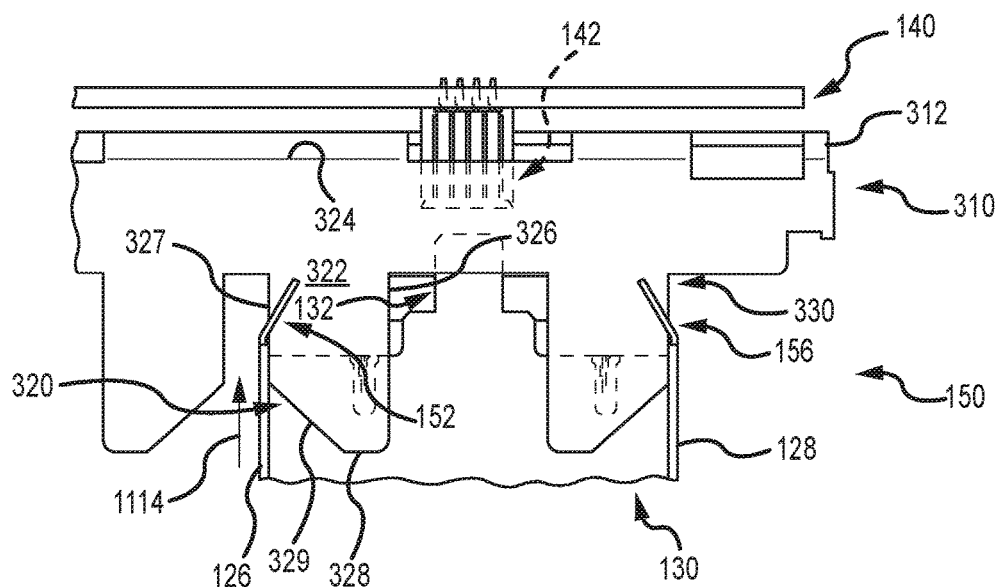

The Y-axis and X-axis alignment are decoupled via the configuration of the guide assembly 150 as X-axis (side-to-side) alignment is handled with different features of the guide assembly than those shown to be used for Y-axis alignment in FIGS. 9 and 10. FIGS. 11 and 12 are partial top views of the device of FIGS. 3, 9, and 10 that illustrate the coarse X-axis alignment provided by the guide assembly with FIG. 11. FIG. 11 shows the module 120 during insertion, as shown with arrow 1110, after initial engagement between the guide members 152, 156 on the module housing 124 and the guide members 320, 330 on the clamp 310.

During this initial engagement, angled or sloped surfaces/portions (such as portion 329) on the two clamp guide members 320, 330 force (with further insertion 1110) the module 120 or its housing 124 to move to the left as shown with arrow 1112 (but may be to the right in other scenarios), and this coarse alignment adjusts the X-axis (or side-to-side) position of the module housing 124 relative to the clamp 310. FIG. 12 shows the module 120 after coarse X-axis alignment has been achieved by the guide assembly 150 and during further insertion 1114 but prior to final blind mate connection is completed between the board connectors 132, 142 (i.e., before fine alignment is provided at/by the connectors themselves).

The interaction of the guide members of the guide assembly 150, in brief, acts (as the module 120 is sliding inward into the interior space of the chassis/enclosure 110 toward the mounted board 140) to provide coarse alignment along the X-axis by forcing the module 120 left (as shown in FIG. 11) or the right as needed to achieve alignment of the arms/guide members 320, 330 of the clamp 310 with the interior surfaces/sides of the module housing's sidewalls 126, 128. This forces or causes a consistent, proper blind mate between the connectors 132, 142 of the boards 130, 140 under all conditions.

While this disclosure contains many specifics, these should not be construed as limitations on the scope of the disclosure or of what may be claimed, but rather as descriptions of features specific to particular embodiments of the disclosure. Furthermore, certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

With the guide assembly taught herein, the blind connector mating is guaranteed by a set of features that are designed into (as a modification or enhancement of) existing module parts (e.g., the exposed and open ends (or leading surfaces) of module sidewalls) and chassis-mounting parts (e.g., a midplane clamp), which may be fabricated of sheet metal, plastic, fiberglass, or other useful material. The guide assembly may be thought of as including carefully designed compound guiding features that act to ensure consistent and reliable mating between electrical interconnects of two or more circuit boards. Any company that designs and/or sells hardware systems (e.g., enclosure-based devices such as computer or telecommunication devices) with hot-swapping capabilities will greatly benefit from use of the guide assembly.

The inventors created the guide assembly as part of a design process for a hot-swappable fan module where the problem is how to manually insert a module that can be relatively long (e.g., 16 inches long) and get a relatively small connector on a fan module PCA to interconnect with blind mating with a receiving or mating connector on a board in a chassis (e.g., a connector on a midplane board). The inventors determined it may be desirable to remove one or more guide pins that were typically used as guiding elements when used in combination with holes in the board(s). These were often ineffective as they had to be quite long such that they sometimes could not properly limit wiggle between the mating components.

The inventors determined it would be desirable to modify components already included in the enclosure-based device to provide the guide assembly. To this end, the guide assembly includes a set of features provided on a board clamp (e.g., on the midplane clamp) and a set of features on the fan housing (or its sidewalls). The guide assembly gathers wiggle in the X and Y axes (i.e., provides 2-axis or compound motion control) but in a decoupled manner that allows the guide assembly to "gather" or guide the mating devices with their connectors first in one direction than in the other direction. For example, the fan housing is configured to have lead-in edges that control Y-axis travel, and the clamp includes lead-in edges to prevent or limit X-axis travel. The bend in the fan housing: (1) guides the fan module into an initial opening (outer plane); (2) "encloses" (at least somewhat) the board connector supported in the fan module housing; and (3) by bending inward, the bend or lead-in edges engage the clamp's guide assembly features sooner in the Y-axis than the X-axis.

The guide assembly provides coarse alignment, whereas fine alignment is provided by the connectors on the chassis-mounted board and the connector(s) on the board in the module. The design of the guide assembly features may be less about the angles or slopes provided on these features lead-in or leading edges than it is about the distance of travel before connectors mate with each other. The geometry (e.g., lead-in edges angles) is defined or set in part by the particular tolerances of the specific components used in the enclosure-based device. In one embodiment, 45-degree chamfered edges were provided on sheet metal edges to avoid inclusion of sharp edges. In the same or other embodiments, 0.5 to 1 millimeter "float" was included in the guide assembly design such that the module being installed was free to float some desired amount so that fine or mating alignment is more achievable (or to avoid an over constrained design). The guide assembly is useful with nearly any module that is configured to slide into a chassis and for which blind mate interconnection is required.

We claim:

1. An apparatus adapted for insertion of modules to provide consistent blind mate interconnection, comprising:
   a chassis comprising a first sidewall and a second sidewall opposite the first sidewall defining an interior space of the chassis;
   a clamp with a planar body extending within the interior space of the chassis between the first and second sidewalls of the chassis;
   a first circuit board attached to the clamp, wherein the circuit board includes a connector extending away from the clamp into the interior space of the chassis;
   a module with a housing including a first sidewall and a second sidewall extending parallel to the first sidewall of the housing of the module, wherein a second circuit board is mounted between the first and second sidewalls of the housing of the module and wherein the second circuit board includes a connector extending outward from the housing of the module proximate to lead-in ends of the first and second sidewalls of the housing of the module; and
   a guide assembly comprising a first set of guide members on the housing of the module and a second set of guide members extending from a body of the clamp,
   wherein abutting contact between the first set of guide members and the second set of guide members forces alignment between the connectors of the first and second circuit boards for blind mate interconnection as the module is inserted into the interior space of the chassis,
   wherein the first set of guide members comprises a first pair of guide members extending from the lead-in end of the first sidewall of the housing of the module that are spaced apart by a first alignment groove extending parallel to a longitudinal axis of the first sidewall of the housing of the module, and
   wherein the first set of guide members comprises a second pair of guide members extending from the lead-in end of the second sidewall of the housing of the module that are spaced apart by a second alignment groove extending parallel to a longitudinal axis of the second sidewall of the housing of the module;
   wherein the second set of guide members comprises a first clamp guide member and a second clamp guide member each with an outer side extending outward from the body of the clamp into the interior space and each with a contact surface that includes a sloped portion angled at an angle of at least 30 degrees away from the outer side;
   wherein each of the first and second clamp guide members includes a planar body orthogonal to the body of the clamp and wherein the planar body of each of the first and second claim guide members has a thickness less than a height of the first and second alignment grooves, whereby the first and second clamp guide members are receivable in the first and second alignment grooves.

2. The apparatus of claim 1, wherein the first set of guide members provide Y-axis alignment between the connectors of the first and second circuit boards and wherein the second set of guide members provide X-axis alignment between the connectors of the first and second circuit boards.

3. The apparatus of claim 2, wherein the X-axis and Y-axis alignments are provided at least partially concurrently by the guide assembly.

4. The apparatus of claim 1, wherein each of the first pair of guide members includes a planar body oriented at a bend angle away from a plane of the first sidewall of the housing of the module toward a center axis of the housing of the module, wherein each of the second pair of guide members includes a planar body oriented at the bend angle away from a plane of the second sidewall of the housing of the module toward a center axis of the housing of the module, and wherein the bend angle is greater than 15 degrees.

5. The apparatus of claim 1, wherein the first and second pairs of guide members each includes an upper guide member with a body having a lead-in side with a contact portion angled at an angle of at least 30 degrees from vertical toward the first and second alignment grooves, respectively, and wherein the first and second pairs of guide member each includes a lower guide member with a body having a lead-in side with a contact portion angled at an angle of at least 30 degrees from vertical toward the first and second alignment grooves, respectively.

6. The apparatus of claim 1, wherein a distance between the outer sides of the first and second clamp member guide members is in the range of 0.5 to 2 millimeters less than a distance between inner surfaces of the first and second sidewalls of the housing of the module and wherein the outer sides of the first and second clamp members has a length greater than a length of the first and second alignment grooves.

7. The apparatus of claim 1, wherein the module comprises a fan module, wherein the first circuit board comprises a midplane board, wherein the second circuit comprises a fan printed circuit assembly (PSA), and wherein the connector of the second circuit board comprises an edge connector.

8. An apparatus for aligned insertion of modules to provide consistent blind mate interconnection, comprising:
   a clamp with a planar body;
   a first circuit board with a connector extending through an opening in a clamp body;
   a module with a housing including a first sidewall and a second sidewall spaced apart from the first sidewall of the housing of the module, wherein a second circuit board is positioned between the first and second sidewalls of the housing of the module and wherein the second circuit board includes a connector; and
   a guide assembly comprising a first set of guide members on the housing of the module and a second set of guide members extending from the clamp body, wherein contact between the first set of guide members and the second set of guide members guides relative movement of the housing relative to the clamp body to provide alignment between the connectors of the first and second circuit boards during blind mate interconnection of the first and second boards, wherein the second set of guide members comprises a first clamp guide member and a second clamp guide member each with an outer side extending orthogonally outward from the clamp body and with a contact surface that includes a sloped portion angled at an angle of at least 30 degrees away from the outer side, wherein the first set of guide members comprises a first pair of guide members extending from the lead-in end of the first sidewall that are spaced apart by a first alignment groove extending parallel to a longitudinal axis of the first sidewall, wherein the second set of guide members comprises a second pair of guide members extending from the lead-in end of the second sidewall that are spaced apart by a second alignment groove extending parallel to a longitudinal axis of the second sidewall, wherein each of the first and second clamp guide members includes a planar body orthogonal to the clamp body, and wherein the planar body of each of the first and second clamp guide members has a thickness less than a height of the first and second alignment grooves, whereby the first and second clamp guide members are receivable in the first and second alignment grooves.

9. The apparatus of claim 8, wherein each of the first pair of guide members includes a planar body oriented at a bend angle away from a plane of the first sidewall toward a center axis of the housing of the module, wherein each of the second pair of guide members includes a planar body oriented at the bend angle away from a plane of the second sidewall toward a center axis of the housing of the module, and wherein the bend angle is greater than 15 degrees.

10. The apparatus of claim 8, wherein the first and second pairs of guide members each includes an upper guide member with a body having a lead-in side with a contact portion angled at an angle of at least 30 degrees from vertical toward the first and second alignment grooves, respectively, and wherein the first and second pairs of guide member each includes a lower guide member with a body having a lead-in side with a contact portion angled at an angle of at least 30 degrees from vertical toward the first and second alignment grooves, respectively.

11. The apparatus of claim 8, wherein a distance between the outer sides of the first and second clamp member guide members is in the range of 0.5 to 2 millimeters less than a distance between inner surfaces of the first and second sidewalls of the module housing of the module and wherein the outer sides of the first and second clamp members has a length greater than a length of the first and second alignment grooves.

12. The apparatus of claim 8, wherein the first set of guide members provide Y-axis alignment between the connectors of the first and second circuit boards, wherein the second set of guide members provide X-axis alignment between the connectors of the first and second circuit boards, and wherein the X-axis and Y-axis alignments are provided at least partially concurrently by the guide assembly.

13. An enclosure-based apparatus adapted for aligned insertion of modules to ensure blind mate interconnection, comprising:

an enclosure comprising a first sidewall and a second sidewall opposite the first sidewall;

a clamp with a planar body between the first and second sidewalls of the enclosure;

a first circuit board attached to the clamp, wherein the circuit board includes a connector;

a module with a housing including a first sidewall and a second sidewall spaced apart from the first sidewall of the housing of the module, wherein a second circuit board is included in the module between the first and second sidewalls of the housing of the module and wherein the second circuit board includes a connector; and a guide assembly comprising a first set of guide members on the housing of the module and a second set of guide members extending from a body of the clamp, wherein abutting contact between the first set of guide members and the second set of guide members forces alignment between the connectors of the first and second circuit boards for blind mate interconnection of the connectors, wherein X-axis alignment and Y-axis alignment are provided at least partially concurrently by the guide assembly, wherein the first set of guide members comprises a first pair of guide members extending from the lead-in end of the first sidewall of the housing of the module that are spaced apart by a first alignment groove extending parallel to a longitudinal axis of the first sidewall of the housing of the module, and wherein the first set of guide members comprises a second pair of guide members extending from the lead-in end of the second sidewall of the housing of the module that are spaced apart by a second alignment groove extending parallel to a longitudinal axis of the second sidewall of the housing of the module; wherein the second set of guide members comprises a first clamp guide member and a second clamp guide member each with an outer side extending outward from the body of the clamp into the interior space and each with a contact surface that includes a sloped portion angled at an angle of at least 30 degrees away from the outer side;

wherein each of the first and second clamp guide members includes a planar body orthogonal to the body of the clamp and wherein the planar body of each of the first and second claim guide members has a thickness less than a height of the first and second alignment grooves, whereby the first and second clamp guide members are receivable in the first and second alignment grooves.

14. The apparatus of claim 13, wherein each of the first pair of guide members includes a planar body oriented at a bend angle away from a plane of the first sidewall of the housing of the module toward a center axis of the housing of the module, wherein each of the second pair of guide members includes a planar body oriented at the bend angle away from a plane of the second sidewall of the housing of the module toward a center axis of the housing of the module, and wherein the bend angle is greater than 15 degrees.

15. The apparatus of claim 13, wherein the first and second pairs of guide members each includes an upper guide member with a body having a lead-in side with a contact portion angled at an angle of at least 30 degrees from vertical toward the first and second alignment grooves, respectively, and wherein the first and second pairs of guide member each includes a lower guide member with a body having a lead-in side with a contact portion angled at an angle of at least 30 degrees from vertical toward the first and second alignment grooves, respectively.

16. The apparatus of claim 13, wherein a distance between the outer sides of the first and second clamp member guide members is in the range of 0.5 to 2 millimeters less than a distance between inner surfaces of the first and second sidewalls of the housing of the module and wherein the outer sides of the first and second clamp members has a length greater than a length of the first and second alignment grooves.

* * * * *

UNITED STATES PATENT AND TRADEMARK OFFICE
CERTIFICATE OF CORRECTION

PATENT NO. : 10,129,997 B2
APPLICATION NO. : 15/399517
DATED : November 13, 2018
INVENTOR(S) : Hofmann et al.

Page 1 of 1

It is certified that error appears in the above-identified patent and that said Letters Patent is hereby corrected as shown below:

In the Claims

In Column 14, Line 1, in Claim 1, delete "claim" and insert -- clamp --, therefor.

In Column 14, Line 64, in Claim 8, after "of the" insert -- module --.

In Column 16, Line 40, in Claim 13, delete "claim" and insert -- clamp --, therefor.

Signed and Sealed this
Twelfth Day of November, 2019

Andrei Iancu
*Director of the United States Patent and Trademark Office*